(12) United States Patent
Maley (10) Patent No.: US 6,249,136 B1
(45) Date of Patent: Jun. 19, 2001

(54) BOTTOM SIDE C4 BUMPS FOR INTEGRATED CIRCUITS

(75) Inventor: Reading G. Maley, San Francisco, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/340,418

(22) Filed: Jun. 28, 1999

(51) Int. Cl.$^7$ .................... G01R 31/28; G01R 31/305; H01L 21/66
(52) U.S. Cl. .................... 324/765; 257/777; 438/17; 324/751
(58) Field of Search .................... 324/754, 765, 324/750, 751; 257/777; 438/14, 17

(56) References Cited

U.S. PATENT DOCUMENTS

| | | |
|---|---|---|
| 3,787,252 | 1/1974 | Filippazzi et al. . |
| 4,585,991 | * 4/1986 | Reid et al. .................... 324/757 |
| 4,956,695 | 9/1990 | Robinson et al. . |
| 4,982,274 | 1/1991 | Murase et al. . |
| 5,039,628 | 8/1991 | Carey . |
| 5,111,278 | 5/1992 | Eichelberger . |
| 5,222,014 | 6/1993 | Lin . |
| 5,247,423 | 9/1993 | Lin et al. . |
| 5,258,648 | 11/1993 | Lin . |
| 5,323,060 | 6/1994 | Fogal et al. . |
| 5,391,917 | 2/1995 | Gilmour et al. . |
| 5,399,898 | * 3/1995 | Rostoker .................... 257/777 |
| 5,426,072 | * 6/1995 | Finnila .................... 257/777 |
| 5,455,445 | * 10/1995 | Kurtz et al. .................... 257/777 |
| 5,482,802 | * 1/1996 | Celler et al. .................... 430/5 |
| 5,521,517 | * 5/1996 | Shida et al. .................... 324/751 |
| 5,564,617 | 10/1996 | Degani et al. . |

(List continued on next page.)

*Primary Examiner*—Ernest Karlsen
(74) *Attorney, Agent, or Firm*—Eschweiler & Associates, LLC (57) ABSTRACT

A method of forming a test configuration for an integrated circuit employing a controlled, collapse chip connection technology to attach to another substrate is disclosed. The method includes the steps of forming one or more vias in a semiconductor substrate corresponding to the integrated circuit and forming circuitry on a top surface of the semiconductor substrate. The method further includes filling the one or more vias with a conductive material to form conductive channels through the semiconductor substrate which selectively couples to the circuitry to provide control signals thereto and receive output signals therefrom. One or more bond pads are formed on a bottom surface of the semiconductor substrate and correspond to the one or more conductive channels. The one or more bond pads on the bottom surface of the semiconductor substrate are coupled to bond pads on the another substrate using the controlled, collapse chip connection technique, which allows the top surface of the semiconductor substrate to be accessible for design verification or circuit test processes. The present invention further includes a controlled, collapse connection chip carrier system which includes a base substrate having one or more bond pads formed thereon and a circuit substrate having circuitry on a top surface thereof and one or more bonds pads on a bottom surface thereof which correspond generally to the one or more bond pads on the base substrate. The circuit substrate further includes one or more conductive channels extending therethrough which electrically couple selective portions of the circuitry on the top surface to the one or more bond pads on the bottom surface. The system further includes a controlled, collapse connection between the one or more bond pads on the base substrate and the one or more bond pads on the bottom surface of the circuit substrate which provides an electrical connection between the base substrate and selective portions of the circuitry on the top surface of the circuit substrate.

7 Claims, 9 Drawing Sheets

U.S. PATENT DOCUMENTS

| | | |
|---|---|---|
| 5,701,085 | 12/1997 | Malladi et al. . |
| 5,715,144 | 2/1998 | Ameen et al. . |
| 5,768,109 | 6/1998 | Gulick et al. . |
| 5,776,790 | 7/1998 | Starr et al. . |
| 5,783,870 * | 7/1998 | Mostafazadeh et al. ............ 257/777 |
| 5,825,080 * | 10/1998 | Imaoka et al. ........................ 257/777 |
| 5,838,060 | 11/1998 | Comer . |
| 5,838,159 * | 11/1998 | Johnson ................................ 324/751 |
| 5,844,416 * | 12/1998 | Campbell ............................. 324/750 |
| 5,861,666 | 1/1999 | Bellaar . |

* cited by examiner

BOTTOM SIDE C4 BUMPS FOR INTEGRATED CIRCUITS

FIELD OF THE INVENTION

The present invention generally relates to integrated circuits and more particularly relates to a system and method of forming a test configuration that facilitates the use of beam probing tools in conjunction with C4 or flip-chip type device interconnection schemes.

BACKGROUND OF THE INVENTION

In the field of microelectronics, multiple integrated circuit chips are often electrically interconnected in order to achieve a desired system circuit configuration. Such interconnections typically are achieved using a conventional printed circuit board in which each integrated circuit is individually packaged, for example, in dual in-line packages (DIP) or surface mount packages. In many circuit applications, such conventional packaging and interconnection methodologies work well, however, as complex circuit systems require higher performance in terms of speed, such conventional methods have shortcomings.

Figure 1:
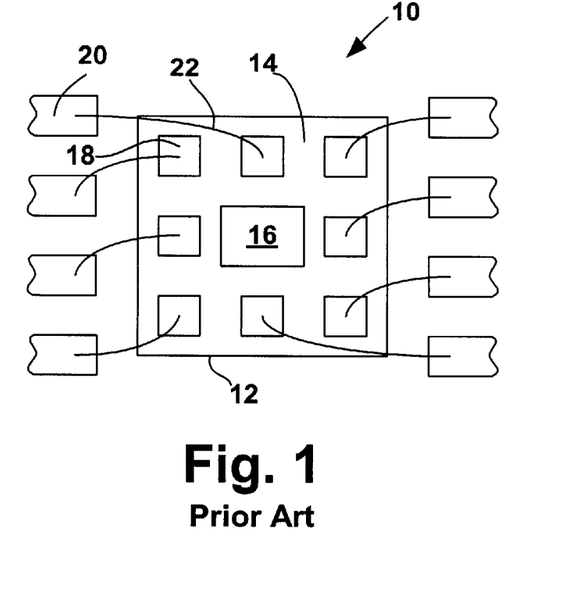
FIG. 1 is a prior art, fragmentary plan view illustrating a semiconductor die coupled to a lead frame via lead wires.

One disadvantage of conventional integrated circuit packages is illustrated in prior art FIG. 1, designated at reference numeral 10. The package 10 includes an integrated circuit chip 12 having a top surface 14 upon which active circuitry 16 and bond pads 18 are formed. The chip 12 is placed upon a mounting portion of a lead frame (not shown) and typically either solder-mounted or epoxy-mounted thereon. The chip 12 is electrically connected to a plurality of leads 20 (which are the lead frame pins which mount to the circuit board) via lead wires 22. Because the lead wires 22 must not exceed predetermined lengths to avoid "collapsed loops" and since lead wires 22 should not cross one another for reliability purposes, the location of the various bond pads 18 is limited, which in some cases results in an inefficient layout of the active circuitry 16 to accommodate the bond pad locations.

In addition, the lead wires 22 are typically connected to the bond pads 18 and the lead wires 22 using a ball-bonding technique in which pressure is applied to the bond pads 18 when forming the electrical connection. In some cases, such pressure can lead to stresses in the circuitry which may compromise the circuit reliability; thus the active circuitry 16 is often not formed under the bond pads 18 as illustrated in FIG. 1, thus further reducing the efficiency of the circuit layout. Further, the lead wires 22 undesirably provide a resistive path between the bond pads 18 and the leads 20 which result in a small, variable voltage drops across the wires 22 and concurrent IR type heating. More significantly, the lead wires 22 have an inductance associated therewith which degrades the circuit performance of the active circuitry 16, particularly as the performance speed of the circuitry is increased.

Figure 2:
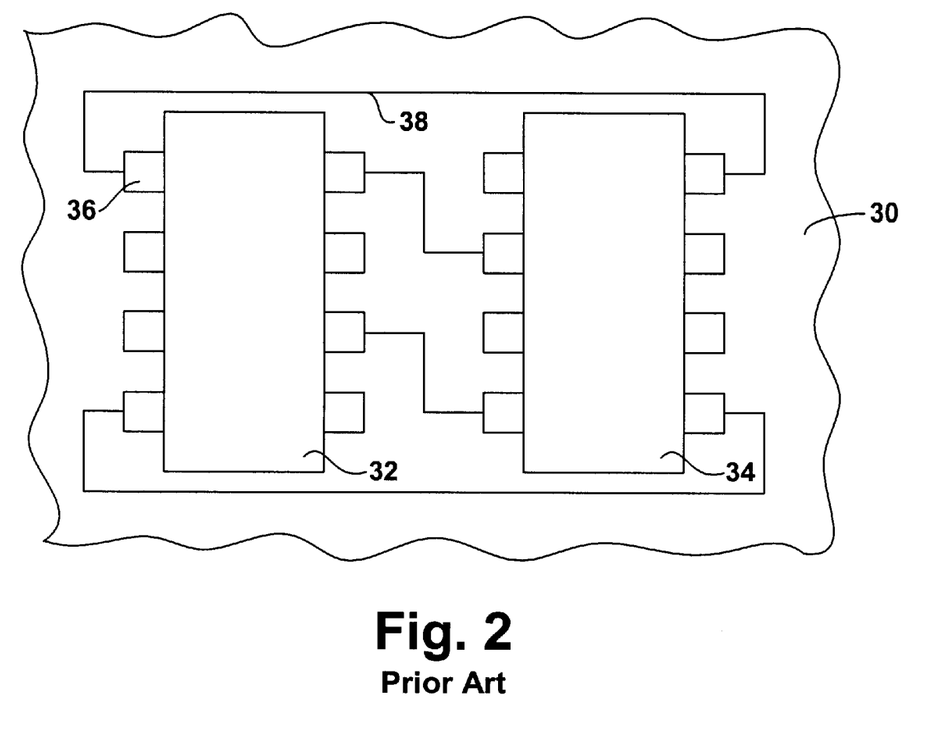
FIG. 2 is a prior art, fragmentary plan view of an integrated circuit board illustrating a plurality of integrated circuit chips mounted thereon and interconnected via printed conductive lines.

Another disadvantage of traditional circuit packaging methodologies is illustrated in prior art FIG. 2. In FIG. 2, a portion of a circuit board substrate 30 has two integrated circuit packages 32 and 34 mounted thereon. Selective pins 36 of the packages are interconnected using printed conductive lines 38, for example, as shown. Note that due to the circuit configuration, the conductive lines 38 are not of an equal length. At low circuit speeds, such length variations are not important, however, in certain high circuit applications, such variation in the lengths of the conductive lines 38 result in a timing skew between various control signals which must be taken into account. One method of addressing such timing skew is to make all the conductive lines 38 between the chips 32 and 34 the same length, which necessarily results in an increase in the length of some of the lines and complicates the layout of the board 30. Alternatively, timing skew is addressed by employing synchronization circuits at the input of the various circuits and the chips 32 and 34. Such a solution, however, increases the circuit complexity and hinders circuit performance. Clearly then, there has been a need to improve the prior art circuit packaging and interconnection methodologies for high performance circuit systems.

Figure 3A:
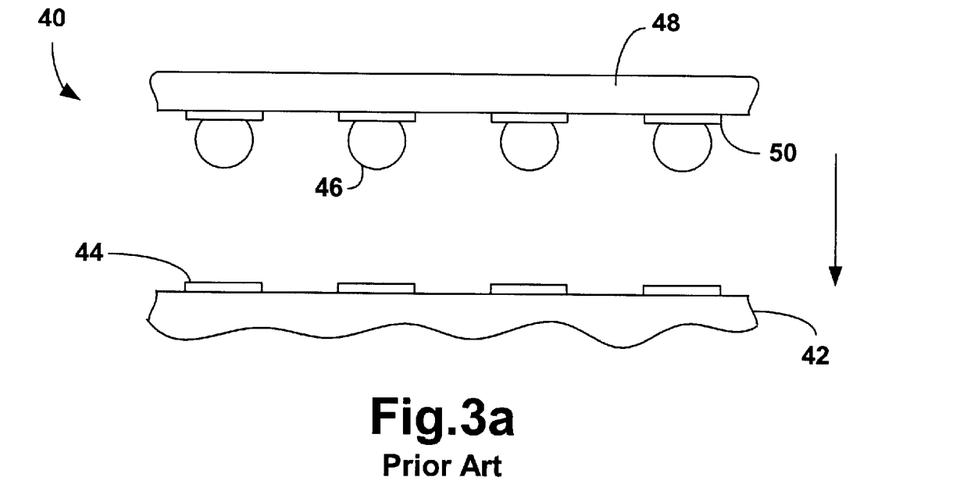
FIG. 3a is a prior art, fragmentary cross section illustrating a C4 or flip-chip type circuit connection technique.

One solution which was developed to address the above limitations in the prior art is the use of solder bumps in a controlled, collapse chip connection (C4) structure (also often called solder bump or flip-chip bonding), as illustrated in prior art FIG. 3a at reference numeral 40. The C4 structure 40 includes a base substrate 42, for example, a circuit socket having bond pads 44 located thereon. Solder bumps 46 are then placed on the bond pads 50 of a second (or top) substrate 48 which is oriented face-down (ie., flip-chip), aligned and brought into contact with the bond pads 44. Electrical interconnections between the bond pads 44 and 50 are formed by heating the solder bumps 46 to a reflow temperature, at which point the solder flows; subsequent cooling results in a fixed, electrically conductive joint to be formed between the bond pads 44 and 50.

The base substrate 42 may be a circuit socket, or alternatively may constitute an integrated circuit board. In the case of a circuit socket, a female-type socket 49a interfaces with an integrated circuit board 49b, as illustrated in prior art FIG. 3b. If, however, the base substrate 42 itself is the circuit board, such C4 connection structures can be implemented on both the top surface and bottom surface thereof, as illustrated in prior art FIG. 4. In such instances, a second semiconductor substrate 52 may similarly be oriented face-down with respect to the base substrate 42 and coupled thereto using solder bumps 46.

Figure 3B:
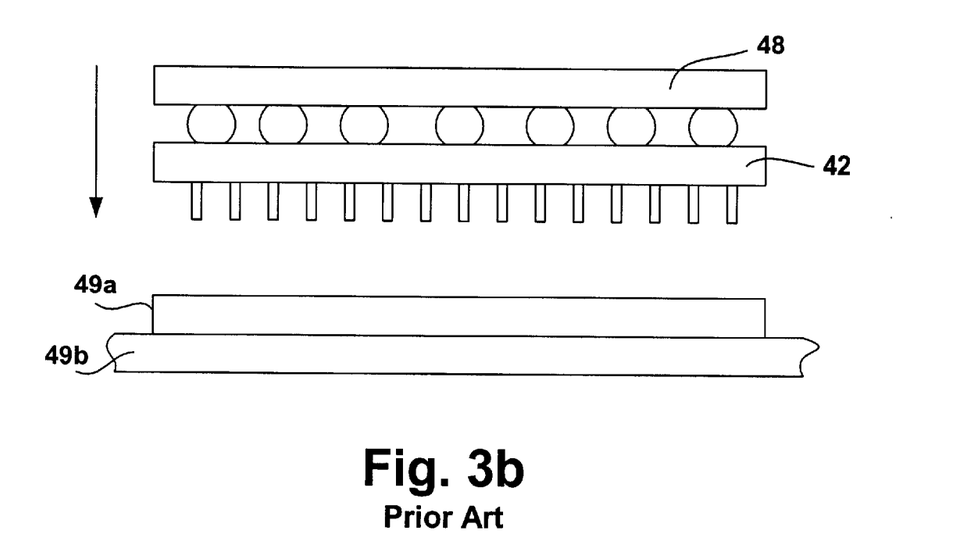
FIG. 3b is a prior art, fragmentary cross section illustrating a C4 or flip-chip type circuit connection using a circuit socket on an integrated circuit board.
Figure 4:
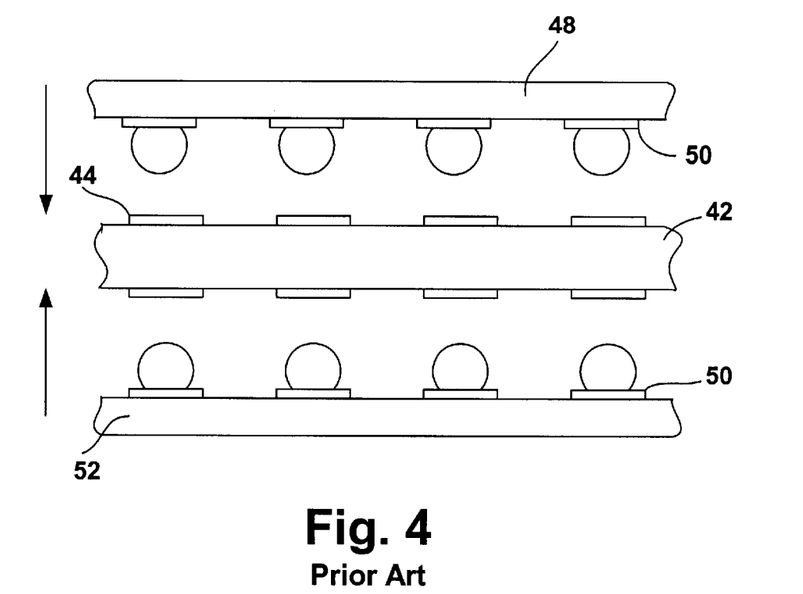
FIG. 4 is a prior art, fragmentary cross section illustrating a *C4* or flip-chip type connection methodology utilizing both sides of a base substrate.
Figure 5:
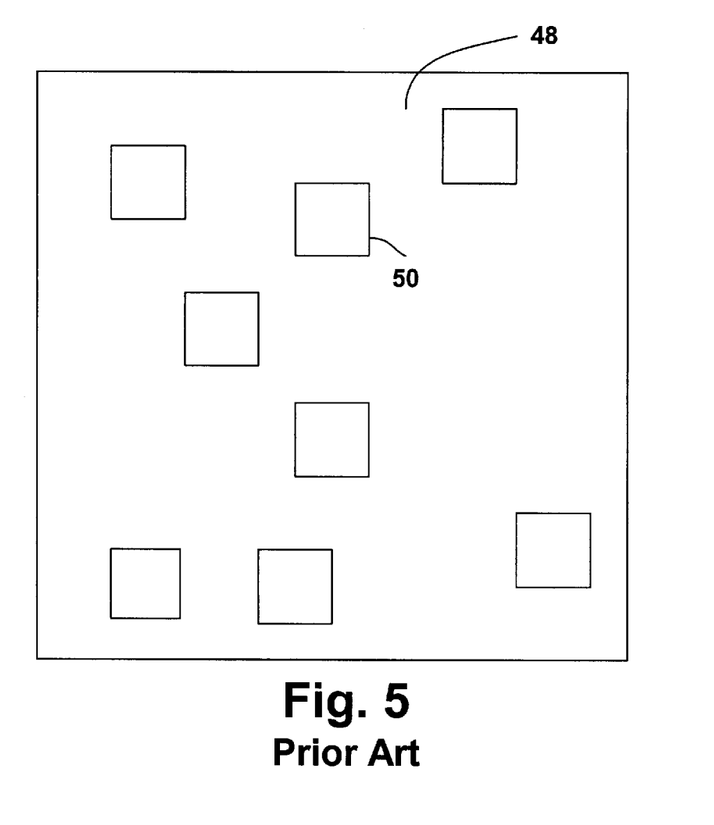
FIG. 5 is a prior art, plan view of a semiconductor die having a plurality of bond pads formed at various locations thereon.

The C4 structure of prior art FIGS. 3a and 3b overcome several disadvantages of the connection methodologies of prior art FIGS. 1 and 2. Initially, C4 bonding eliminates the lead wires 22 and their associated resistance and inductance. Furthermore, eliminating the lead wires 22 increases the freedom a designer has to lay out the circuitry on the chip more efficiently. In addition, C4 bonding greatly reduces the conductive interconnection paths between the respective circuits, thus improving the speed and reducing the timing skew therebetween. Lastly, because the ball-bonding attachment technique is avoided, significantly less stress is placed on the bond pads during connection, which allows active circuitry to be formed under the pads. This additional level of flexibility allows the circuitry to be laid out without regard to the bond pad locations and further allows the bond pad locations above the active circuitry to be located in an optimized fashion to directly couple with circuitry on another substrate. Therefore the bond pads 50 may be located anywhere on the substrate 48 as illustrated in prior art FIG. 5, without the need to form such interconnections on peripheral edges of the die.

The C4 or flip-chip bonding technique discussed above does provide advantages over other prior art packaging and connection methodologies, however, the C4 connection structure does have an number of disadvantages. Typically, C4 connections are used with complex integrated circuits such as microprocessors. With such complex circuit designs, it is important to verify the design. Such design verification is performed with software via design simulations and also with hardware, by subjecting the circuit to direct testing after being fabricated.

Direct testing of the circuit may be performed in a variety of ways. One form of direct testing is called electron beam probing (i.e., e-beam) which provides the ability to evaluate electrical potentials on the die surface providing an electrical contact thereto. The electron beam probes any visible metal line of the active circuitry and the impact of the high energy electrons of the electron beam results in the emission of secondary electrons from the die surface. The secondary electrons are detected and variations in the energy of the emitted secondary electrons are monitored. Such energy variations are proportional to the surface potential of the circuitry and therefore result from the propagation of electrical signals through the circuitry. Thus, the electron probing technique may be used to determine whether the circuitry is operating as expected in response to the I/O stimulus provided by a tester.

Another common circuit analysis tool is the focused ion beam (FIB) probing or milling technique. FIB employs an ion beam of a heavy element (e.g., gallium) which is targeted on the die surface. Because the ions are heavy enough to remove atoms as opposed to merely removing electrons, FIB probing may be used to modify the surface structure of the circuitry on the die. Therefore FIB may be used to perform "microsurgery" on test dies, for example, by altering a metallization pattern thereon.

Yet another common design verification tool is an electrical probing system. With an electrical prober, one or more probes are brought into contact with the die surface upon which the active circuitry lies. Using the probes, electrical signals may be applied thereto and both parametric and functional tests may be performed at the bond pads. In addition, the probes may contact various conductive lines and perform analysis on various isolated circuit portions which may otherwise be isolated by analyzing the circuit performance at the bond pads.

Electron beam, FIB probing and electrical probe testing have become important tools and steps in the integrated circuit design procedure. The C4 or flip-chip design structure, however, has severely limited the applicability of these types of probing or test techniques. Because the flip-chip connections employ solder bumps on bond pads which reside on the active or top surface of the device, the device must be mounted face-down on the substrate to achieve the electrical contact thereto. Thus, when connected, the active or top region of the dies is now blocked and is inaccessible to a probing beam or test probes for design analysis or verification.

It is an object of the present invention to overcome the above disadvantages as well as other disadvantages associated with C4 or flip-chip type connections.

SUMMARY OF THE INVENTION

The present invention relates to a system and method of improving circuit interconnection methodologies that utilize C4 or flip-chip type bonding techniques using channels which extend through one or more semiconductor substrates. Such channels may be electrically conductive to facilitate electrical interconnection of the substrates, may be thermally conductive to facilitate the transfer of heat away from the circuitry on the substrates for improved thermal management, or both.

According to one aspect of the present invention, a system and method of forming a test configuration for an integrated circuit is disclosed. One or more vias are formed in a semiconductor substrate having circuitry on a top surface thereof. The vias are filled with a conductive material to form conductive channels that enable a connection to the circuitry on the top surface from the bottom surface of the semiconductor substrate. Bond pads corresponding to the conductive channels are formed on the bottom surface of the semiconductor substrate which are then electrically coupled to another substrate such as a ceramic package or circuit board. In such a configuration, the top surface of the semiconductor substrate is accessible to a variety of analysis tools such as electron beam or focused ion beam probing techniques.

According to another aspect of the present invention, a stacked, multi-chip module is disclosed in which a plurality of semiconductor substrates are electrically interconnected through one or more conductive channels which extend through the substrates. Using bond pads which correspond to the conductive channels, the stacked semiconductor substrates are coupled together using C4 or flip-chip type connections. The conductive channels connect to selective portions of circuitry on top surfaces of the respective substrates and transmit thereto and receive therefrom electrical signals between the various semiconductor substrates in the stack. The conductive channels are insulated from their respective substrates, thus allowing the conductive channels to be located near the circuitry to which they electrically connect and providing locational flexibility for interconnecting with neighboring semiconductor substrates in the stack.

According to another aspect of the present invention, a flip-chip type circuit arrangement and associated method which employs improved thermal management is disclosed. A semiconductor substrate for use in a flip-chip connection methodology or a stacked, multi-chip module has one or more thermally conductive channels formed therein. The thermally conductive channels facilitate the transfer of heat dissipated by circuitry away from the substrate. The channels may be openings which allow ambient air to pass therethrough or may be filled with a thermally conductive material. The arrangement may be further supplemented with a means for forcing a fluid through the channels to further aid in an efficient transfer of heat away from the device.

The present invention further contemplates the thermally conductive channels utilized in conjunction with a stacked, multi-chip module, wherein each of the semiconductor substrates have one or more thermally conductive channels therein. The substrates within the stack may further include a thermally conductive, electrically insulated material disposed therebetween to improve the thermal contact with the thermally conductive channels. In addition, the module may further have one or more heat sink structures in thermal contact with the periphery of the module to further facilitate heat transfer away from the multi-chip modules.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 6:
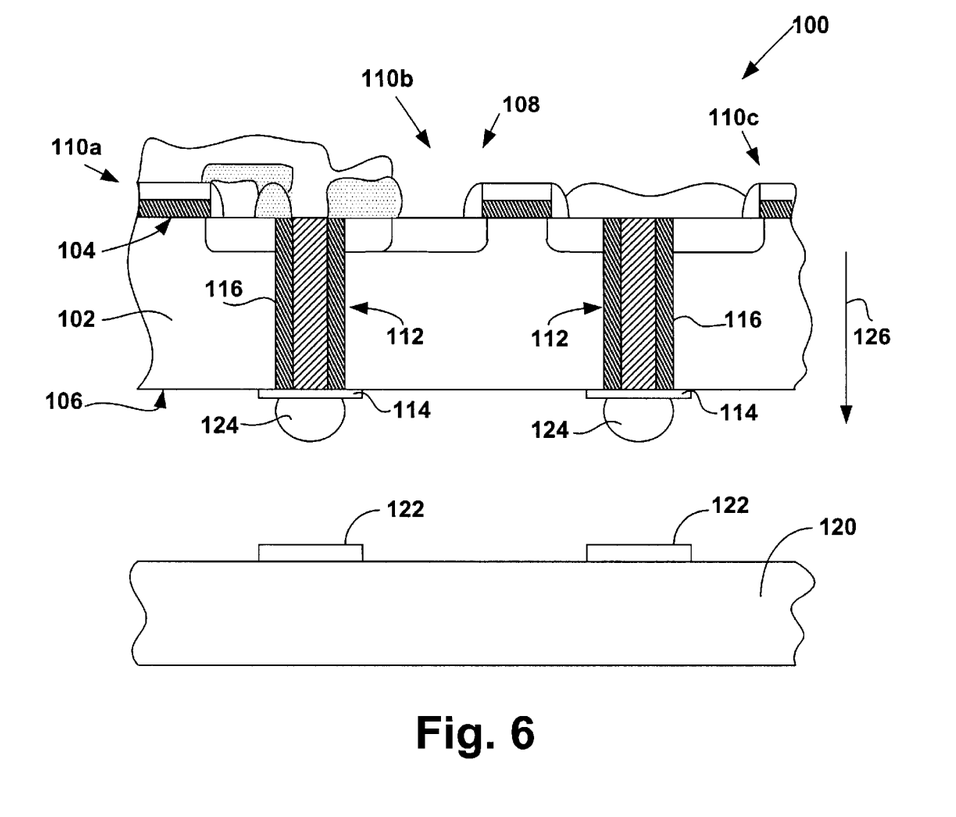
FIG. 6 is a fragmentary cross section diagram illustrating a bottom-side C4 or flip-chip connection technique using isolated conductive channels according to the present invention.

The following is a detailed description of the present invention made in conjunction with the attached Figures, wherein like reference numerals will refer to like elements throughout. The present invention relates to an apparatus and method of forming an integrated circuit design verification and test system which facilitates surface analysis techniques to be employed for integrated circuits employed in C4 (e.g., flip-chip) type connection methodologies. One exemplary embodiment of the present invention is illustrated in FIG. 6 and designated at reference numeral 100. The configuration 100 includes a semiconductor substrate 102 having a top surface 104 and a bottom surface 106. The top surface 104 of the semiconductor substrate 102 has circuitry 108 formed thereon according to any one of many conventional semiconductor processing techniques. For example, as illustrated in FIG. 6, portions of three different MOS-type transistors 110a–110c are illustrated.

The semiconductor substrate 102 further includes one or more conductive channels 112 which extend through the substrate 102 from the top surface 104 to the bottom surface 106. Preferably, the conductive channels are formed of aluminum or copper, however, other conductive materials may be used and are contemplated as falling within the scope of the present invention. The channels 112 selectively couple to portions of the circuitry 108 on the top surface 104. For example, as illustrated in FIG. 6, one of the channels couples to a gate terminal of the first MOS transistor 110a while the other channel connects to the source of the second transistor 110b and the drain of the third transistor 110c, respectively. The conductive channels 112 conduct electrical signals to and from the circuitry 108 on the top surface 104 to the bottom surface 106 of the semiconductor substrate 102.

The channels 112 couple to bond pads 114 on the bottom surface 106. Although now shown for the sake of simplicity, the bond pads 114 are electrically isolated from the substrate 102 and one another according to conventional practice. In addition, the channels 122 are preferably electrically insulated from the semiconductor substrate 102 by insulating regions 116 which are disposed between the conductive channels 112 and the substrate 102. The insulating regions 116 preferably are silicon dioxide ($SiO_2$), however, other insulating materials may be employed and are contemplated as falling within the scope of the present invention. The insulating regions 116 prevent the signals being transmitted in the conductive channels 112 from disturbing the bias voltage of the semiconductor substrate 102 (which is typically either a ground potential or a Vss). Of course, in some cases, one of the terminals of the circuitry 108 on the top surface 104 may be held at a substrate potential, in which case, the appropriate conductive channel 112 may be non-insulated and thus be in electrical contact with the substrate being held at a similar potential, as may be desired.

The test configuration 100 of FIG. 6 further includes another substrate 120 which serves as a package substrate or socket (or alternatively may be a system level circuit board). The package substrate 120 connects to circuitry or conductive lines (not shown) to a test apparatus which provides one or more test I/O signals to provide functional and/or parametric testing of the circuitry 108 on the semiconductor substrate 102. The package substrate 120 includes one or more bond pads 122 which generally correspond to the bond pads 114 on the semiconductor substrate 102. According to an exemplary embodiment of the present invention, solder bumps 124 are placed on the bond pads 114 and the substrates 102 and 120, are aligned and are heated, wherein the solder bumps 124 flow. Upon cooling, the flowed solder bumps form fixed, conductive connections between the substrates 102 and 120. Alternatively, the package substrate 120 may have spring-biased type contacts (not shown) instead of the bond pads 122, wherein the contacts are substantially aligned with the bond pads 114 of the semiconductor substrate 102. Upon placing the semiconductor substrate 102 into contact with the package substrate in the direction of the arrow 126, the spring-biased contacts make electrical contact and are urged against the bond pads 114 to establish electrical connection thereto.

Once interconnected, the package substrate 120 may be used to transmit electrical signals to and receive electrical signals from the semiconductor substrate 102. The signals are transmitted through the conductive channels 112 to the circuitry on the top surface 104 of the semiconductor substrate 102. In accordance with the present invention, the semiconductor substrate is coupled to the package substrate 120 (a base substrate or circuit board either directly or in a circuit socket) in a C4 or flip-chip type connection configuration, however, the semiconductor substrate 102 is not face-down as in prior art configurations. Instead, the substrate 102 is "face-up", meaning that the top surface of the substrate 102 is exposed and accessible for design verification and testing. Because the conductive channels exist through the substrate 102, the advantages of the prior art C4 interconnection schemes are maintained while eliminating the previously highlighted disadvantages associated therewith.

Figure 7:
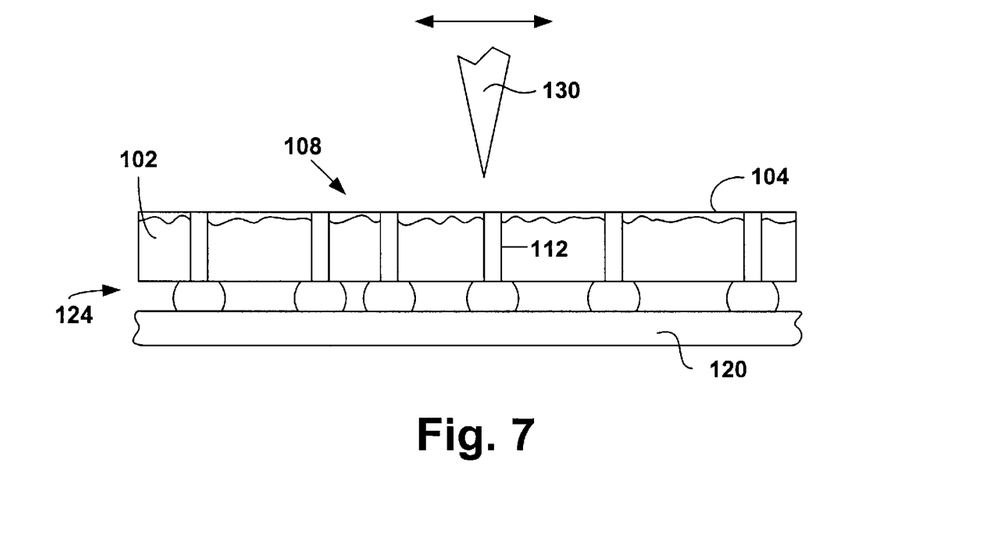
FIG. 7 is a cross section view illustrating the bottom-side C4 or flip-chip connection methodology of the present invention which allows a probing of the active circuitry on a top side thereof upon connection to a test fixture.

FIG. 7 is a cross section diagram which illustrates the advantages of the present invention. In FIG. 7, the semiconductor substrate 102 is coupled using a C4 solder bump connection to the package substrate 120, which in this exemplary embodiment is a printed circuit board. The circuit board 120 provides I/O stimulus to the semiconductor substrate 102 via the solder connections 124 and conductive channels 112. Because the semiconductor substrate 102 is not upside-down, the circuitry 108 is accessible to a probe tool 130 such as an electron beam probe, a focused ion beam (FIB) probe or an electrical probe testing device, as illustrated in FIG. 7. The probe 130 may freely access the circuitry 108 on the top surface 104 of the semiconductor substrate 102, thus allowing designers and technicians the ability to scan the probe 130 across the surface 104 and generate SEM-type images. In addition, the probe 130 can be used in conjunction with detectors to determine whether the circuitry 108 is operating as expected or may be used to effectuate circuit repair.

Figure 8:
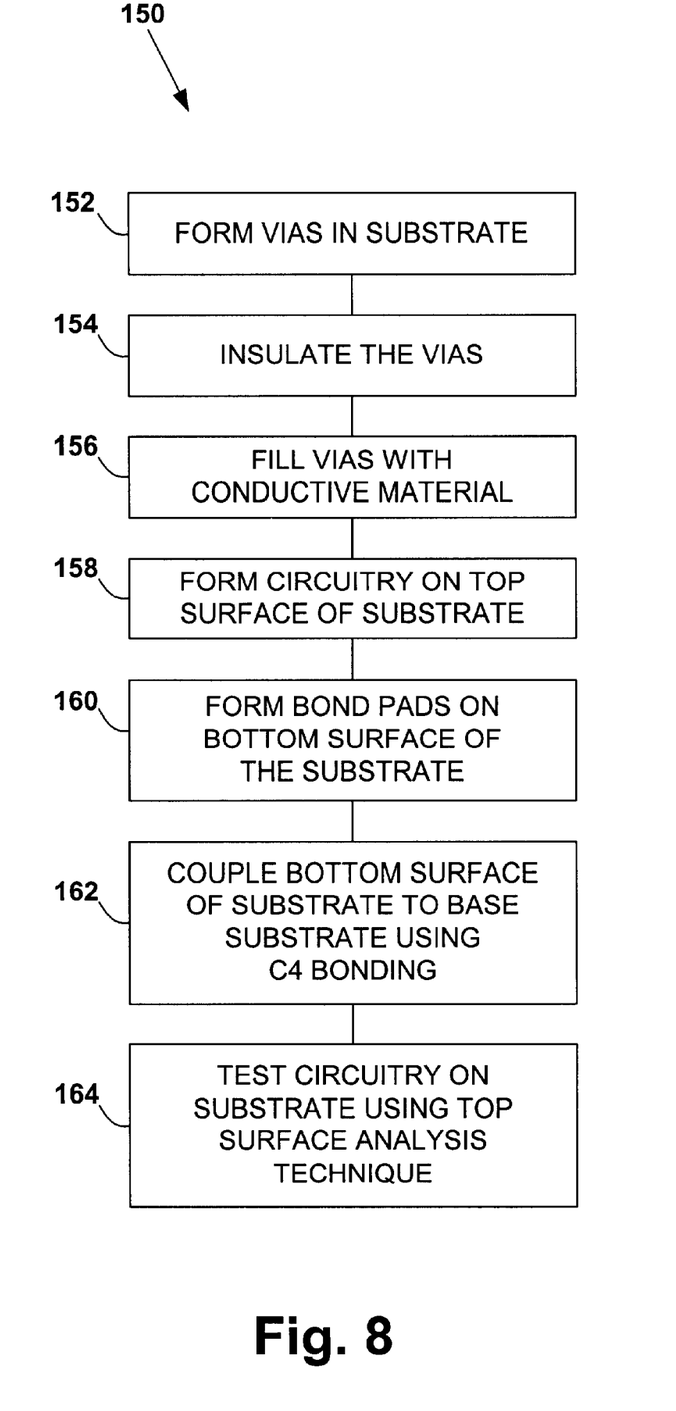
FIG. 8 is a flow chart diagram illustrating a method of forming and testing circuitry utilizing a C4 bonding methodology according to the present invention.

A method 150 of forming such a device and test configuration 100 is illustrated in FIG. 8. First, the semiconductor substrate 102 has one or more vias formed therethrough from the top surface 104 through the bottom surface 106 at Step 152. The vias may be formed using a highly directional etch such as reactive ion etching (RIE), or alternatively may be formed by laser drilling. Alternatively, any manner of forming the vias may be used and is contemplated as falling within the scope of the present invention. Next, the one or more vias are insulated at Step 154 by lining the vias with an insulating material. According to an exemplary embodiment of the present invention, Step 154 is achieved by placing the substrate 102 into an oxidation furnace for a predetermined period of time to facilitate oxide growth according to conventional techniques. Alternatively, an oxide may be deposited instead of grown according to conventional deposition techniques. Further, although an oxide is preferred, other insulating materials may be used (e.g., nitride, a ceramic, etc.) and are contemplated as falling within the scope of the present invention.

The method 150 continues at Step 156, wherein the insulated vias are filled with an electrically conductive material such as aluminum, copper or another metal. Alternatively, other materials such as doped polysilicon or other electrically conductive materials may be utilized. The insulated vias are filled using, for example, conventional plating techniques or conventional thin film deposition processing techniques. Any process, however, for filling the vias are contemplated as falling within the scope of the present invention. Upon the completion of Step 156, the conductive channels are completed. Circuitry 108 is then formed on the top surface 104 of the substrate 102 according to any number of conventional processing techniques. Bond pads 114 are then formed on the bottom surface 106 of the substrate 102 at Step 160 to prevent electrical connection to the test or base substrate 120.

The bottom surface 106 of the substrate 102 is then coupled to the base substrate 120 using C4 bonding interconnection techniques, as described above. Alternatively, however, the semiconductor substrate 102 may be coupled electrically to the base substrate 120 using a spring-biased contact type socket interconnection methodology at Step 162. At this time, the semiconductor substrate 102 is electrically coupled to the substrate 120 and is operable to receive and transmit electrical signals to and from the active circuitry 108 thereon. The method 150 then continues at Step 164 where the circuitry 108 on the semiconductor substrate 102 is tested using top surface analysis techniques such as the probing tools discussed above. For example, an electron beam probe may scan the circuitry 108, wherein the electron beam generates secondary electron emissions on the surface which are detected. In particular, the probing tool may be utilized in conjunction with detectors to detect the changes in the energy of the secondary electrons, the changes being a function of the electrical signals being transmitted through the circuitry 108. By doing so, and comparing the detected changes to expected changes, the analysis tool may be utilized to ascertain whether the circuitry 108 is functioning as expected in the design.

Step 164 in the method 150 may also, for example, be implemented in the following manner. The circuitry 108 on the top surface 104 of the substrate 102 may be scanned using a focused ion beam (FIB), for example, to perform repairs of the circuitry, for example, altering the metallization of a particular conductive line on the top surface 104 of the substrate 102. Lastly, an electrical probe test apparatus may be utilized to evaluate the circuit design in a variety of ways.

As can be seen from the above, the channels 112 of the present invention allow for a C4 type interconnection methodology to be established between the semiconductor substrate 102 and either a test substrate or a printed circuit board 120, while maintaining the top surface 104 of the semiconductor substrate 102 face-up. Therefore, even upon attachment of the semiconductor substrate 102 to the other substrate 120, design and test verification analysis tools may be utilized to further analyze the design on the semiconductor substrate 102.

Figure 9:
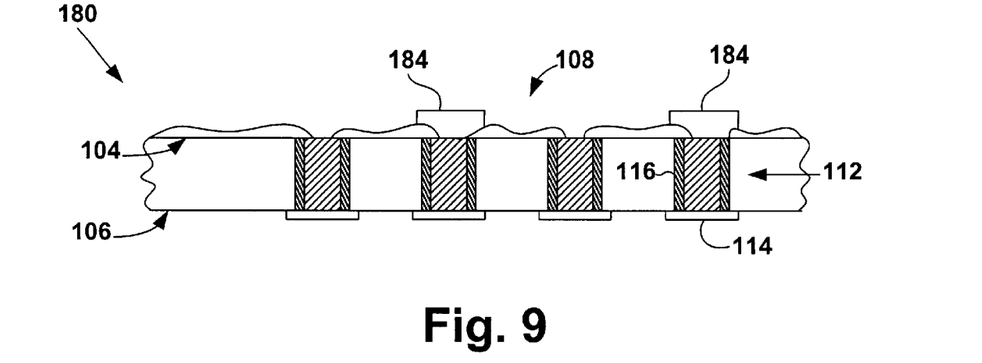
FIG. 9 is a fragmentary cross section illustrating a structure for electrically coupling to a substrate having isolated conductive channels therein on both a top side and a bottom side thereof according to the present invention.

According to another embodiment of the present invention, a stacked, multi-chip module is disclosed. The present invention allows for a plurality of semiconductor substrates to be directly interconnected using a C4 or flip-chip type interconnection methodology, thus further reducing timing skew and delays over the prior art. One of the semiconductor substrates used in such a multi-chip module is illustrated in FIG. 9 at reference numeral 180. The substrate 180 is similar to the substrate 102 of FIG. 6 in many respects. For example, the substrate 180 has a top surface 104 and a bottom surface 106 with circuitry 108 on the top surface 104 thereof. Portions of the circuitry 108 are electrically connected to the bottom surface 106 via the conductive channels 112 which are electrically insulated from the substrate 180. Bond pads 114 are formed on the bottom surface 106 which correspond to the channels 112 and the bond pads 114 are also insulated (not shown) from the substrate 180. In addition, one or more bond pads 184 are formed on the top surface 104 of the substrate 180 and allow a C4 type connection to be made to the top surface 104. Therefore the substrate 180 may be sandwiched between two substrates and may be connected thereto with C4 type connections on both sides, thus effectuating direct connections between the sandwiched substrates.

The conductive channels 112 are insulated from the semiconductor substrate 180, which provides important performance advantages. Without electrical insulation, a time-varying electrical signal on the channel 112 will cause a time-varying bias to develop on portions of the substrate 180 which are local to the channel 112. A floating, unpredictable substrate bias is highly undesirable in many cases because it can cause a forward-biasing of reverse-biased tanks therein and thus cause latch-up type conditions or avalanche breakdown problems. Although one might attempt to address such a problem by carefully spacing the channels away from portions of the substrate which are susceptible to the problems discussed above, such spacing requirements are highly undesirable and severely limited the efficiency in which the circuitry 108 can be laid out on the semiconductor substrate. In addition, such spacing requirements tend to undesirably limit the positioning of the channels 112 of the substrate 180 and require longer conductive interconnections on the top surface 104 of the die. Lastly, requiring a minimum spacing may mitigate the problem, however, the problem associated therewith is not entirely eliminated and may result in degraded circuit reliability. The insulating regions 116 disposed between the channels 112 and the substrate 180 allow the channels 116 to be intimately formed with any circuitry 108 on the die, particularly the portions of circuitry to which it will interconnect. Thus the insulation about the channels enables significant performance advantages of eliminating potential latch-up or breakdown problems and provide the circuit designer maximum flexibility in the layout of the circuitry 108 and the channels 112 to optimize various differing design criteria, as may be desired.

Note that in FIG. 9, each of the channels 112 has a bond pad 114 attached to the bottom surface 106, while only two of the channels have bond pads 114 on the top surface 104. This difference is provided to illustrate that some channels 112 connect a lower or bottom substrate to the circuitry 108 on the semiconductor substrate 180, while other channels may couple both a lower or bottom substrate and an upper or top substrate to the circuitry 108. Similarly, as is contemplated by the present invention, the circuitry 108 may only couple to an upper or top substrate, in which case, the channel would only have a top bond pad and would not require a channel running through the substrate at that location. Further, it is possible that a given channel may not even connect to the circuitry 108 on its own substrate 180, but instead may simply interconnect an upper and a lower substrate through the semiconductor substrate 180, as may be desired. Any such interconnection schemes are contemplated by the present invention.

Figure 10:
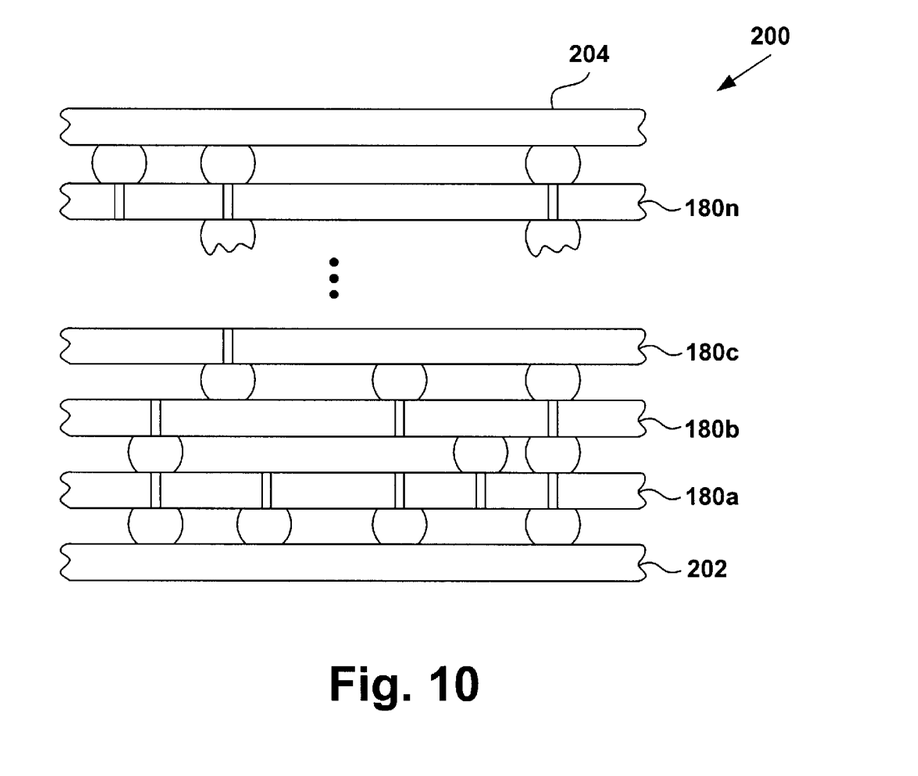
FIG. 10 is a fragmentary cross section diagram illustrating a stacked, multi-chip module employing isolated conductive channels according to the present invention.

One exemplary manner in which the conductive channels which are isolated from the substrate may be utilized to form a stacked, multi-chip module is illustrated in FIG. 10. In FIG. 10, portions of various substrates 180a–180n which constitute the stacked, multi-chip module 200 are illustrated in which the substrates 180a–180n are interconnected. The multi-chip module 200 includes a base stack substrate 202 which has circuitry thereon (typically on the top surface) and one or more bond pads on the top surface. The base stack substrate 202 may be a semiconductor substrate or other type substrate such as a printed circuit board and interconnects to a first of "n" stacked semiconductor substrates 180a via a C4 or flip-chip type interconnection. The stacked semiconductor substrates 180a–180n each have circuitry thereon and have conductive channels therethrough which connect to portions of the active circuitry thereon or simply couple to bond pads (not shown) to interconnect differing substrates in the stack (e.g., substrates 180a and 180c), or both.

A top stack substrate 204 has circuitry thereon (typically on the bottom surface, i.e., substrate is face-down) and one or more bond pads on its bottom surface. The top stack substrate 204 may be a semiconductor substrate or another type of substrate such as a printed circuit board, and interconnects with the "$en^{th}$" semiconductor substrate 180n via a C4 interconnection. Thus, as can be seen, the stack of semiconductor substrates 180a–180n can be directly interconnected with each other and with the base and top stacks substrates as may be desired. The insulated conductive channels allow a high degree of flexibility in the interconnection scheme, as discussed above.

Figure 11:
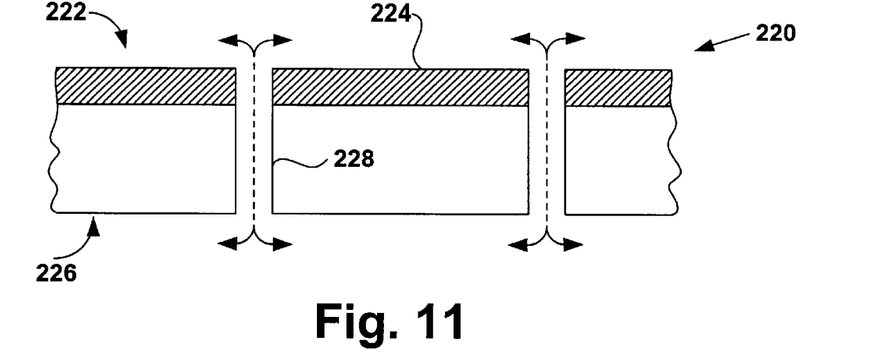
FIG. 11 is a fragmentary cross section diagram illustrating a structure for improving the thermal management of an integrated circuit using a thermally conductive channel according to the present invention.

According to another embodiment of the present invention, a system and method of employing stacked, multi-chip modules is disclosed. A semiconductor substrate used in such a multi-chip module is illustrated in FIG. 11, and designated at reference numeral 220. The substrate 220 has a top surface 222 with circuitry 224 formed thereon, as well as a bottom surface 226. The substrate 220 further includes one or more thermally conductive channels 228 which extend from the top surface 222 to the bottom surface 226 thereof. The thermally conductive channels 228 provide for improved transfer of heat (caused by heat dissipation from the circuitry 224) away from the substrate 220. According to one exemplary embodiment of the present invention, the thermally conductive channels 228 are filled with ambient air; alternatively, however, any thermally conductive material may be formed therein and such materials are contemplated as falling within the scope of the present invention.

Figure 12:
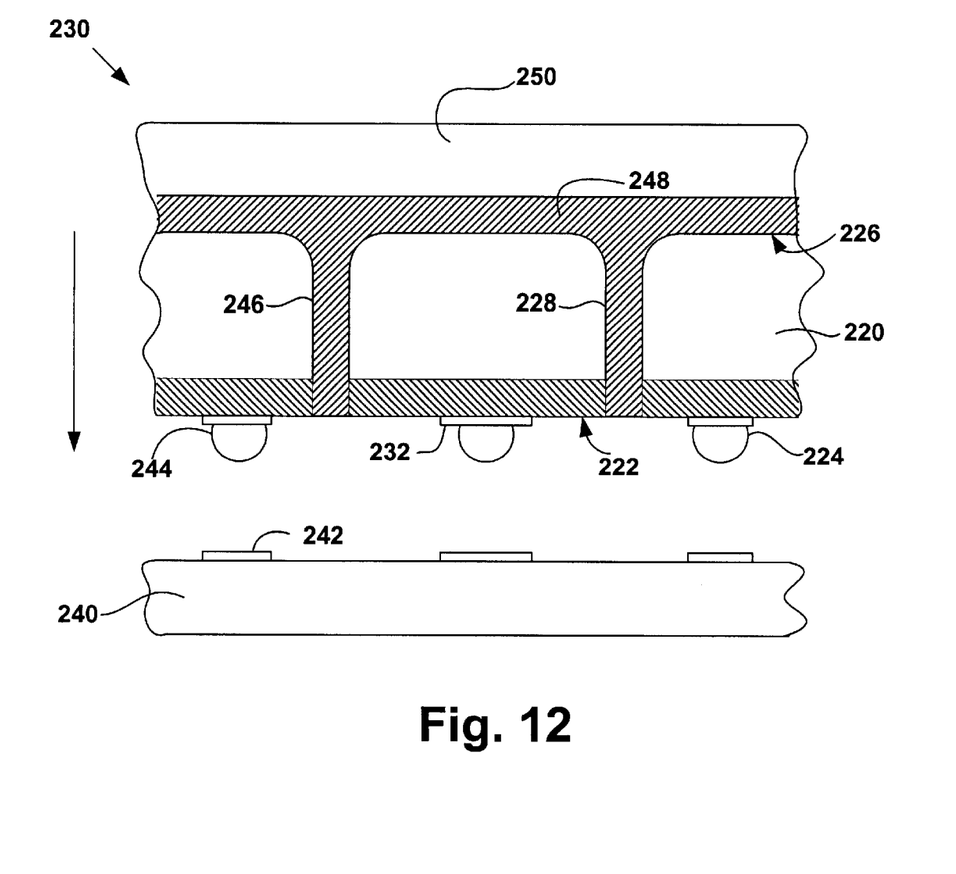
FIG. 12 is a fragmentary cross section diagram illustrating a structure for improving the thermal management of an integrated circuit having a thermally conductive channel in a C4 or flip-chip type connection configuration according to the present invention.

The thermally conductive channels 228 of FIG. 11 may be used in conjunction with the electrically conductive channels described supra, however, such a configuration is not required. The substrate 220 of FIG. 11 may be used in a flip-chip connection, as illustrated in FIG. 12 at reference numeral 230. In FIG. 12, the substrate 220 is flipped upside-down and one or more bond pads 232 are formed on the top surface 222 and electrically connect the circuitry 224 to a base substrate 240 via bond pads 242 which generally correspond with the bond pads 232 on the semiconductor substrate 220. The electrical connection is further facilitated via the use of the solder balls 244 in a manner similar to that described above.

In prior art flip-chip circuit configuration, thermal management issues are major concerns. The flip-chip arrangement 230 of the present invention, however, efficiently transfers heat dissipated by the circuitry 224 away from the substrate 220 via the thermally conductive channels 228. In addition, according to a preferred embodiment of the present invention, the heat transfer can be further facilitated by filling the channels 228 with a material having a high thermal conductivity, such as a thermally conductive paste 246. In addition, a thermally conductive layer 248 or paste may be placed on the bottom surface 226 of the substrate 220, along with a heat sink 250 which overlies the thermally conductive layer 248. The layer 248 helps to spread the heat from the channels 228 across the entire bottom portion 226 of the substrate 220, thus greatly increasing the thermal contact with the heat sink 250. The heat sink 250 may be any one of many shapes and/or materials to maximize the heat transfer therefrom, for example, having a plurality of fins, etc. to increase the surface area for heat transfer. In the above manner, instead of the circuitry 224 getting hot due to the heat dissipation, the thermally conductive channels 228 efficiently channel the heat to the bottom surface 226 of the substrate 220, wherein the heat is distributed across the entire surface and interfaced with the heat sink 250 via the thermally conductive layer 248.

In addition, the arrangement 230 may be further supplemented with a pump or fan mechanism (not shown) which may be used to force a fluid through the channels 228 to more efficiently carry the heat away. For example, a fan may pump or draw ambient air through the channels 228 to cool the substrate 220 or a system may be employed in which a fluid is forced through the channels 228 to collect the heat, transferred through another structure having a substantial thermal mass to transfer the heat thereto and then be recirculated back through the channels 228. Such a fluid may be air, but may include other fluids, for example, Freon, liquid nitrogen, etc.

Figure 13:
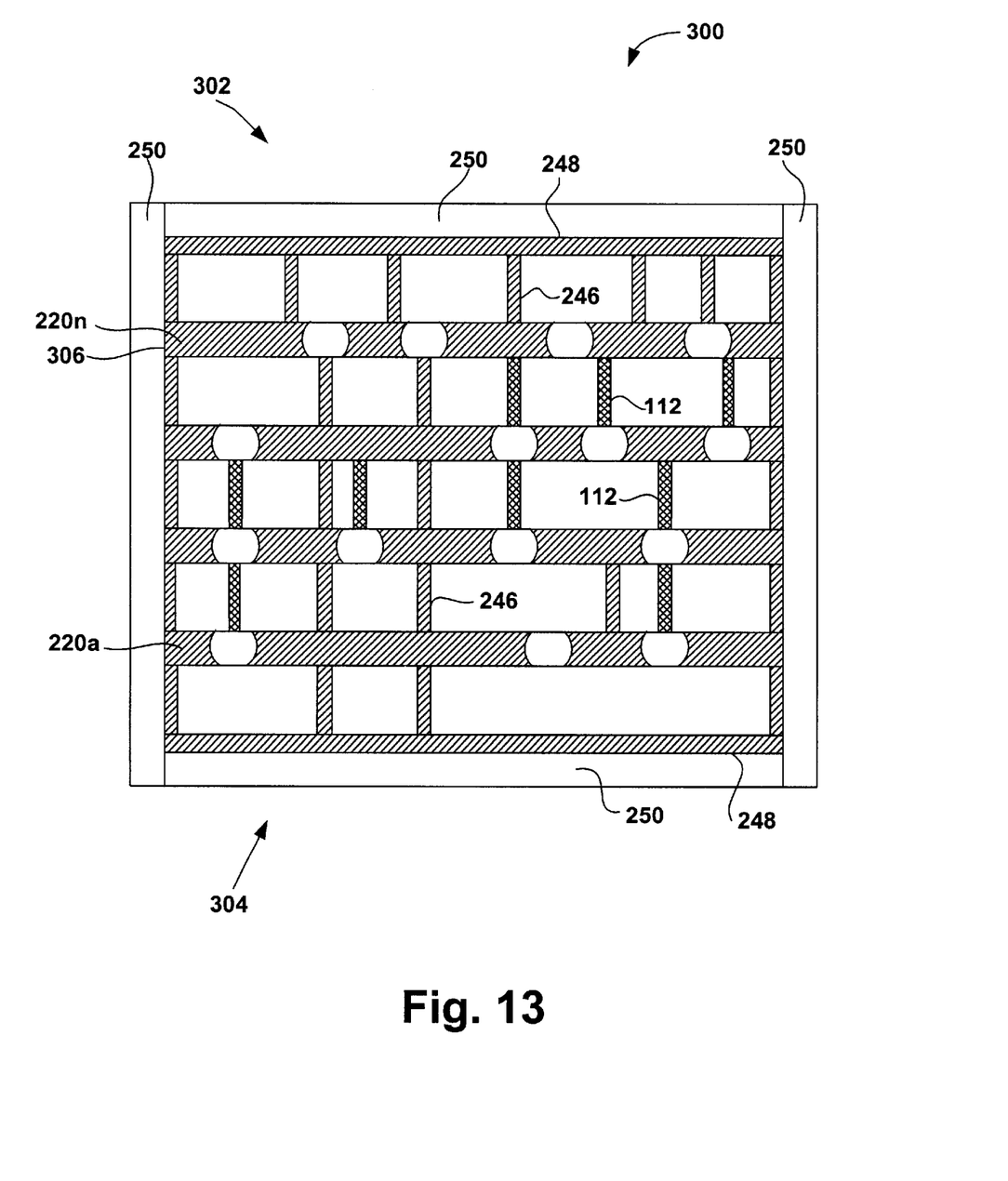
FIG. 13 is a cross section diagram illustrating a stacked, multi-chip module having improved thermal management capabilities having thermally conductive channels in a C4 or flip-chip type connection methodology according to the present invention.

The thermally conductive channels 228 of the present invention can be expanded to address thermal management issues in a multi-chip module 300 composed of a plurality of stacked semiconductor substrates, such as the system 200 of FIG. 10. Such an implementation is illustrated in FIG. 13 at reference numeral 300. In such a module 300, each of the substrates 220a–220n have both electrically conductive channels 112 and thermally conductive channels 228 extending therethrough. In addition, the thermally conductive layers 248 are disposed between the substrates 220a–220n and aid to spread out the heat and increase the rate at which the heat is transferred away therefrom. In addition, one or more heat sinks 250 may be located on the top 302 and the bottom 304 of the module 300 as well as on one or more of the peripheral edges 306 thereof.

Figure 14:
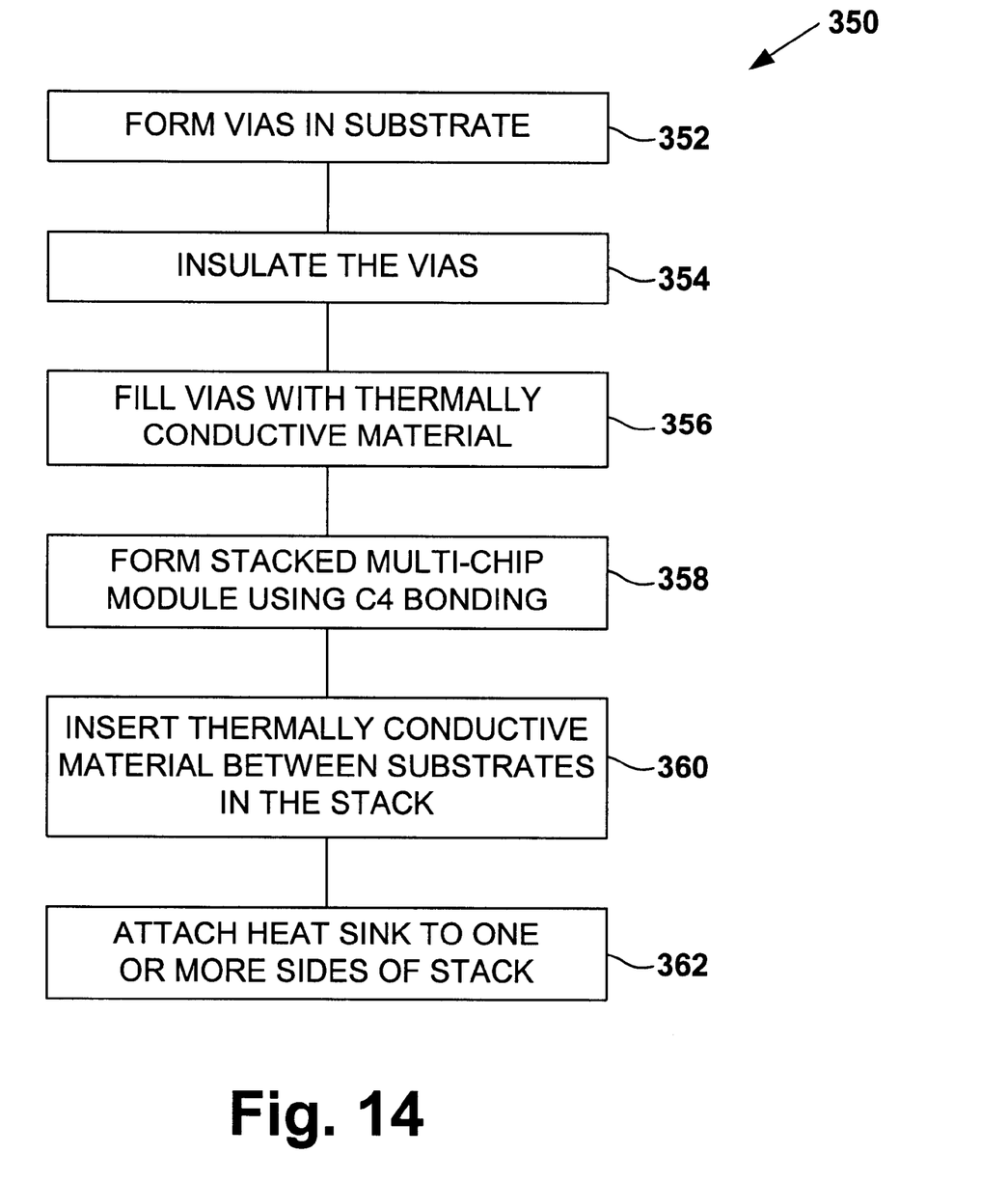
FIG. 14 is a flow chart diagram illustrating a method of dissipating heat in a C4 or flip-chip type circuit connection by forming thermally conductive channels in the substrate according to the present invention.

A method of forming a multi-chip module such as the module 300 of FIG. 13 is illustrated in FIG. 14, designated at reference numeral 350. The method 350 begins by forming vias or channels 228 in the substrate 220, for example, by RIE-type etching or laser drilling. The next Step 354 is optional, but preferred, and includes insulating the vias 228 with an electrically insulating material. Such insulation is preferred to avoid any potential electrically conduction particulates from influencing the substrate potential in the event such a particulate gets stuck in one or more of the vias. Further, such insulation mitigates the impact of any potential static charge build-up in the vias 228 on the substrate 220.

The vias or channels 228 are then filled with a thermally conductive material at Step 356. To the extent that air is used as the material, Step 356 simply includes allowing the air to pass therethrough. Otherwise, other thermally conductive materials such as thermally conductive pastes or other layers may be forced into the channels 228 or formed via various types of film deposition or growth techniques, plating, etc.

A plurality of such substrates 220 are then coupled together at Step 358 using C4 type bonding as discussed supra. The method 350 may be complete at this point or may be further optimized at Step 360 inserting thermally conductive material 248 between the substrates to improve the rate of heat transfer away from the substrates 220. Further, such optimization may be further improved at Step 362 by attaching a heat sink 250 to the module 300, or otherwise bringing the heat sink 250 into thermal communication therewith. Step 362 further improves the heat transfer away from the module 300. Alternatively, Step 362 may include the step of pushing or drawing a fluid through the channels 228 to further facilitate heat transfer from the module 300, as may be desired.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming and testing an integrated circuit in a controlled, collapse chip connection board configuration, comprising the steps of:

forming circuitry on a top surface of a semiconductor substrate;

forming one or more conductive channels through the semiconductor substrate from the top surface to a bottom surface of the semiconductor substrate, wherein the one or more conductive channels make selective contact to the circuitry;

attaching the bottom surface of the semiconductor substrate to another substrate using the controlled, collapse chip connection technique;

accessing the circuitry on the top surface of the semiconductor substrate with a probe to verify a circuit design; and determining whether the circuit design meets one or more design criteria using the probe.

2. The method of claim 1, wherein accessing the circuitry with a probe comprises irradiating the circuitry with an electron beam.

3. The method of claim 2, wherein determining whether the circuit design meets one or more design criteria using the probe further comprises:

detecting an emission of electrons from the top surface of the semiconductor substrate due to the electron beam;

converting the detected emission into a video image of the circuitry; and evaluating the video image to determine an existence of flaws in the circuitry.

4. The method of claim 2, wherein determining whether the circuit design meets one or more design criteria using the probe further comprises:

providing a predetermined set of one or more input control signals to the circuitry;

detecting a variation in a potential energy of electrons emitting from the top surface of the semiconductor substrate due to the electron beam and a propagation of electric signals through the circuitry due to the input control signals; and determining whether the circuitry is functioning properly by comparing the variation in the potential energy from the top surface of the semiconductor substrate to an expected potential energy variation.

5. The method of claim 1, wherein accessing the circuitry with a probe comprises irradiating the circuitry with a focused ion beam.

6. The method of claim 5, wherein determining whether the circuit design meets one or more design criteria further comprises:

detecting an emission of electrons from the top surface of the semiconductor substrate due to the focused ion beam;

converting the detected emission into a video image of the circuitry; and evaluating the video image to determine an existence of flaws in the circuitry.

7. The method of claim 1, further comprising:

identifying a portion of the circuitry having a flaw based on the determining step; and irradiating the portion of the circuitry with a focused ion beam, wherein the ion beam removes material on the top surface of the semiconductor substrate corresponding to the portion of the circuitry, thereby modifying the top surface and thus modifying the circuitry to effectuate a repair thereof.

* * * * *

UNITED STATES PATENT AND TRADEMARK OFFICE
CERTIFICATE OF CORRECTION

PATENT NO. : 6,249,136 B1
DATED : June 19, 2001
INVENTOR(S) : Reading G. Maley

It is certified that error appears in the above-identified patent and that said Letters Patent is hereby corrected as shown below:

Column 2,
Line 19, please replace the word "ie." with -- *i.e.* --.

Column 10,
Line 12, please replace the word "en$^{th}$" with -- n$^{th}$ --.

Signed and Sealed this

Twenty-second Day of January, 2002

Attest:

Attesting Officer

JAMES E. ROGAN
Director of the United States Patent and Trademark Office